United States Patent
Green

(10) Patent No.: US 12,244,188 B2
(45) Date of Patent: Mar. 4, 2025

(54) INDUCTION MOTORS INCLUDING SPEED SENSING CIRCUITS FOR MOTOR CONTROL

(71) Applicant: Copeland LP, Sidney, OH (US)

(72) Inventor: Charles Green, Fenton, MO (US)

(73) Assignee: Copeland LP, Sidney, OH (US)

( * ) Notice: Subject to any disclaimer, the term of this patent is extended or adjusted under 35 U.S.C. 154(b) by 348 days.

(21) Appl. No.: 17/568,273

(22) Filed: Jan. 4, 2022

(65) Prior Publication Data

US 2022/0345015 A1 Oct. 27, 2022

Related U.S. Application Data

(60) Provisional application No. 63/177,630, filed on Apr. 21, 2021, provisional application No. 63/177,634, filed on Apr. 21, 2021.

(51) Int. Cl.
*H02K 17/04* (2006.01)
*G01R 31/34* (2020.01)
(Continued)

(52) U.S. Cl.
CPC ........... *H02K 17/04* (2013.01); *G01R 31/343* (2013.01); *H02K 1/16* (2013.01); *H02K 3/12* (2013.01); *H02P 1/28* (2013.01); *H02K 2213/03* (2013.01)

(58) Field of Classification Search
CPC ........... H02K 17/04; H02K 1/16; H02K 3/12; H02K 2213/03; H02K 11/21; H02K 17/08; H02P 1/445; G01R 31/343
See application file for complete search history.

(56) References Cited

U.S. PATENT DOCUMENTS

| | | |
|---|---|---|
| 2,762,004 A | 9/1956 | Shepardson |
| 3,504,863 A | 4/1970 | Burkland et al. |

(Continued)

FOREIGN PATENT DOCUMENTS

| | | | |
|---|---|---|---|
| CN | 202014085 U | * | 10/2011 |
| EP | 1742348 B1 | | 3/2011 |

(Continued)

OTHER PUBLICATIONS

InspectAPedia: Electric Motor Start/Run Capacitator Operation, http://inspectapedia.com/electric/Start_Capacitor_Operation.php; 2021; 14 pages.

(Continued)

*Primary Examiner* — Bickey Dhakal
(74) *Attorney, Agent, or Firm* — Harness, Dickey & Pierce, P.L.C.

(57) ABSTRACT

An induction motor assembly includes an induction motor, and one or more switches coupled to selectively inhibit the supply of power from a power source to at least one of a main winding and an auxiliary winding of the motor. A control circuit is configured to obtain a main winding voltage value representative of a voltage across the main winding, receive an auxiliary winding voltage value according to a sensed voltage across the auxiliary winding, and determine at least one of a rotational speed of the induction motor and a load of the induction motor, according to the main winding voltage value and the auxiliary winding voltage value. The control circuit is configured to control switching operation of the one or more switches according to the determined rotational speed or the determined load, or generate a log of the determined rotational speed or the determined load in memory for monitoring.

19 Claims, 8 Drawing Sheets

(51) Int. Cl.
  *H02K 1/16* (2006.01)
  *H02K 3/12* (2006.01)
  *H02P 1/28* (2006.01)

(56) References Cited

U.S. PATENT DOCUMENTS

| | | | |
|---|---|---|---|
| 3,529,223 | A | 9/1970 | Vergez, Jr. |
| 3,545,684 | A | 12/1970 | Hilmanowski |
| 4,387,329 | A | 6/1983 | Harlow |
| 4,492,911 | A | 1/1985 | Molitor |
| 4,659,975 | A | 4/1987 | Vincent |
| 4,780,658 | A | 10/1988 | Koyama |
| 5,187,419 | A | 2/1993 | DeLange |
| 5,247,237 | A | 9/1993 | Koyama et al. |
| 5,276,392 | A * | 1/1994 | Beckerman ............ H02P 25/04 |
| | | | 318/774 |
| 6,194,864 | B1 | 2/2001 | Kinpara et al. |
| 6,407,530 | B1 | 6/2002 | Kwon et al. |
| 6,594,592 | B1 | 7/2003 | Griepentrog et al. |
| 7,365,959 | B1 | 4/2008 | Ward |
| 7,448,563 | B2 | 11/2008 | Berger et al. |
| 7,538,507 | B2 | 5/2009 | Lu et al. |
| 7,583,127 | B2 | 9/2009 | Sibrai et al. |
| 7,679,307 | B2 | 3/2010 | Mills, Jr. et al. |
| 7,768,227 | B2 | 8/2010 | Vaez-Zadeh et al. |
| 7,971,810 | B2 | 7/2011 | Hirsch et al. |
| 8,120,305 | B2 | 2/2012 | Kim |
| 8,270,143 | B2 | 9/2012 | Stockman |
| 8,371,824 | B2 | 2/2013 | Jeong et al. |
| 8,456,795 | B2 | 6/2013 | Stockman |
| 8,618,761 | B2 | 12/2013 | Hudson et al. |
| 8,764,409 | B2 | 7/2014 | Han et al. |
| 9,222,246 | B2 | 12/2015 | VanAssche et al. |
| 9,422,698 | B2 | 8/2016 | Gormley et al. |
| 9,506,231 | B2 | 11/2016 | Gormley et al. |
| 9,806,660 | B1 | 10/2017 | Chretien et al. |
| 9,815,064 | B2 | 11/2017 | Hirsch et al. |
| 9,869,077 | B2 | 1/2018 | Gormley et al. |
| 10,471,438 | B2 | 11/2019 | Chavez |
| 10,804,830 | B1 | 10/2020 | Zhang et al. |
| 2003/0030408 | A1 * | 2/2003 | Ratz ........................ H02P 25/04 |
| | | | 318/772 |
| 2006/0175999 | A1 | 8/2006 | Min |
| 2007/0057647 | A1 | 3/2007 | Burkhart et al. |
| 2008/0094022 | A1 * | 4/2008 | Horikoshi ............... H02P 29/00 |
| | | | 318/802 |
| 2009/0213523 | A1 | 8/2009 | Slaughter |
| 2011/0109258 | A1 | 5/2011 | Fei et al. |
| 2012/0159984 | A1 * | 6/2012 | Hatipoglu ................ H02P 1/42 |
| | | | 318/786 |
| 2015/0115076 | A1 | 4/2015 | Gormley et al. |
| 2016/0197566 | A1 | 7/2016 | Alvey et al. |
| 2017/0085204 | A1 | 3/2017 | Didat |
| 2017/0117812 | A1 * | 4/2017 | Furtner ............ H02M 3/33592 |
| 2018/0131296 | A1 * | 5/2018 | Zanelato ................. H02P 25/04 |
| 2020/0171507 | A1 | 6/2020 | Berger et al. |

FOREIGN PATENT DOCUMENTS

| | | |
|---|---|---|
| GB | 716089 A | 9/1954 |
| GB | 745978 A | 3/1956 |
| IN | 258054 | 11/2013 |
| JP | H11146691 A * | 5/1999 |
| JP | 2003348872 A | 12/2003 |
| KR | 101908629 B1 | 10/2018 |
| WO | WO-2020020346 A1 * | 1/2020 ............ F23N 1/062 |

OTHER PUBLICATIONS

Induction Motors, Trade of Electrician, Standards Based Apprenticeship Course Notes, Phase 2, Module No. 2.4, Unit No. 2.4.1., Revision Nov. 4, 2013, 48 pages.
What is Speed Control Induction Motor? by Linquip Team, circuitglobe.com, Jan. 26, 2021, 7 pages.
Determining Electric Motor Load and Efficiency, Motor Challenge Fact Sheet, U.S. Department of Energy, accessed Apr. 8, 2022, www.motor.doe.gov, 6 pages.
International Search Report regarding Application No. PCT/US2022/025588 dated Aug. 9, 2022.
Written Opinion of the ISA regarding Application No. PCT/US2022/025588 dated Aug. 9, 2022.

* cited by examiner

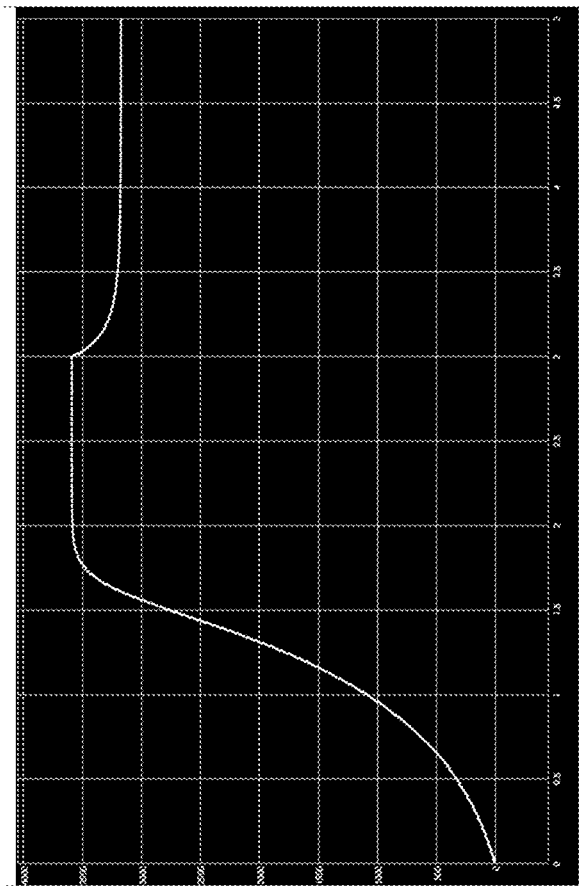
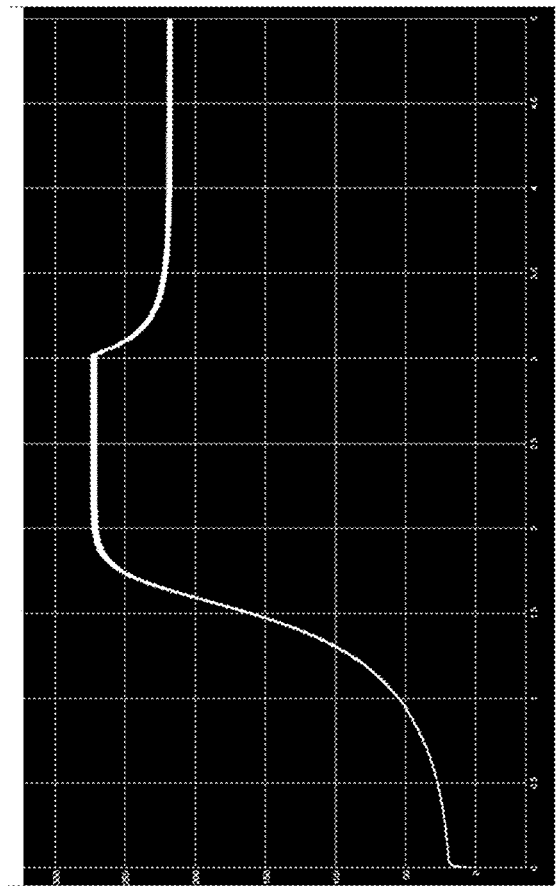
FIG. 7A
FIG. 7B

INDUCTION MOTORS INCLUDING SPEED SENSING CIRCUITS FOR MOTOR CONTROL

CROSS-REFERENCE TO RELATED APPLICATIONS

This application claims the benefit and priority of U.S. Provisional Application No. 63/177,630, filed on Apr. 21, 2021, and U.S. Provisional Application No. 63/177,634, filed on Apr. 21, 2021. The entire disclosures of each of the above applications are incorporated herein by reference.

FIELD

The present disclosure relates to induction motors including speed sensing circuits for motor control.

BACKGROUND

This section provides background information related to the present disclosure which is not necessarily prior art.

The speed or load of an induction motor may be sensed for operational, informational or protective reasons. For example, the speed of a motor may be sensed to determine when to change switching operation associated with the motor, or when the motor has slowed for reapplying a start winding. Speed or load sensors may be deployed to sense the speed of the motor directly, but this approach can be expensive or impractical in terms of the requirement for additional sensors and space in the design. Complex modeling places a greater burden on a processor and also requires an additional current sensor.

SUMMARY

This section provides a general summary of the disclosure, and is not a comprehensive disclosure of its full scope or all of its features.

According to one aspect of the present disclosure, an induction motor assembly includes an induction motor having a stator core including a stator yoke and a plurality of teeth extending from the stator yoke toward a central opening, with the central opening extending from a first end of the stator core to a second end of the stator core opposite the first end, and the plurality of teeth spaced apart from one another and defining a plurality of slots between the plurality of teeth. The motor further includes a main winding and an auxiliary winding located within the plurality of slots and wrapped around the plurality of teeth, with the main winding coupled with a line terminal to receive power from a power source, and the auxiliary winding coupled with the line terminal to receive power from the power source. The assembly includes one or more switches coupled between the line terminal and at least one of the main winding and the auxiliary winding, to selectively inhibit the supply of power from the power source to the at least one of the main winding and the second winding, and a control circuit coupled to control switching operation of the one or more switches. The control circuit is configured to obtain a main winding voltage value representative of a voltage across the main winding, receive an auxiliary winding voltage value according to a sensed voltage across the auxiliary winding, and determine at least one of a rotational speed of the induction motor and a load of the induction motor, according to the main winding voltage value and the auxiliary winding voltage value. The control circuit is configured to control switching operation of the one or more switches according to the determined rotational speed or the determined load, or generate a log of the determined rotational speed or the determined load in memory for monitoring.

According to another aspect of the present disclosure, a method of controlling an induction motor assembly is disclosed. The assembly includes an induction motor having a stator core including a stator yoke and a plurality of teeth extending from the stator yoke toward a central opening, with the central opening extending from a first end of the stator core to a second end of the stator core opposite the first end, and the plurality of teeth spaced apart from one another and defining a plurality of slots between the plurality of teeth. The motor further includes a main winding and an auxiliary winding located within the plurality of slots and wrapped around the plurality of teeth, and one or more switches coupled between the line terminal and the at least one of the main winding and the auxiliary winding. The method includes obtaining a main winding voltage value representative of a voltage across the main winding, receiving an auxiliary winding voltage value according to a sensed voltage across the auxiliary winding, and determining at least one of a rotational speed of the induction motor and a load of the induction motor, according to the main winding voltage value and the auxiliary winding voltage value. The method includes controlling switching operation of the one or more switches according to the determined rotational speed or the determined load, or generating a log of the determined rotational speed or the determined load in memory for monitoring.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7A is a waveform illustrating an example simulated speed of the motor of FIG. 1.

FIG. 7B is a waveform illustrating an example simulated voltage across the auxiliary winding of FIG. 1.

Corresponding reference numerals indicate corresponding parts throughout the several views of the drawings.

DETAILED DESCRIPTION

Figure 1:
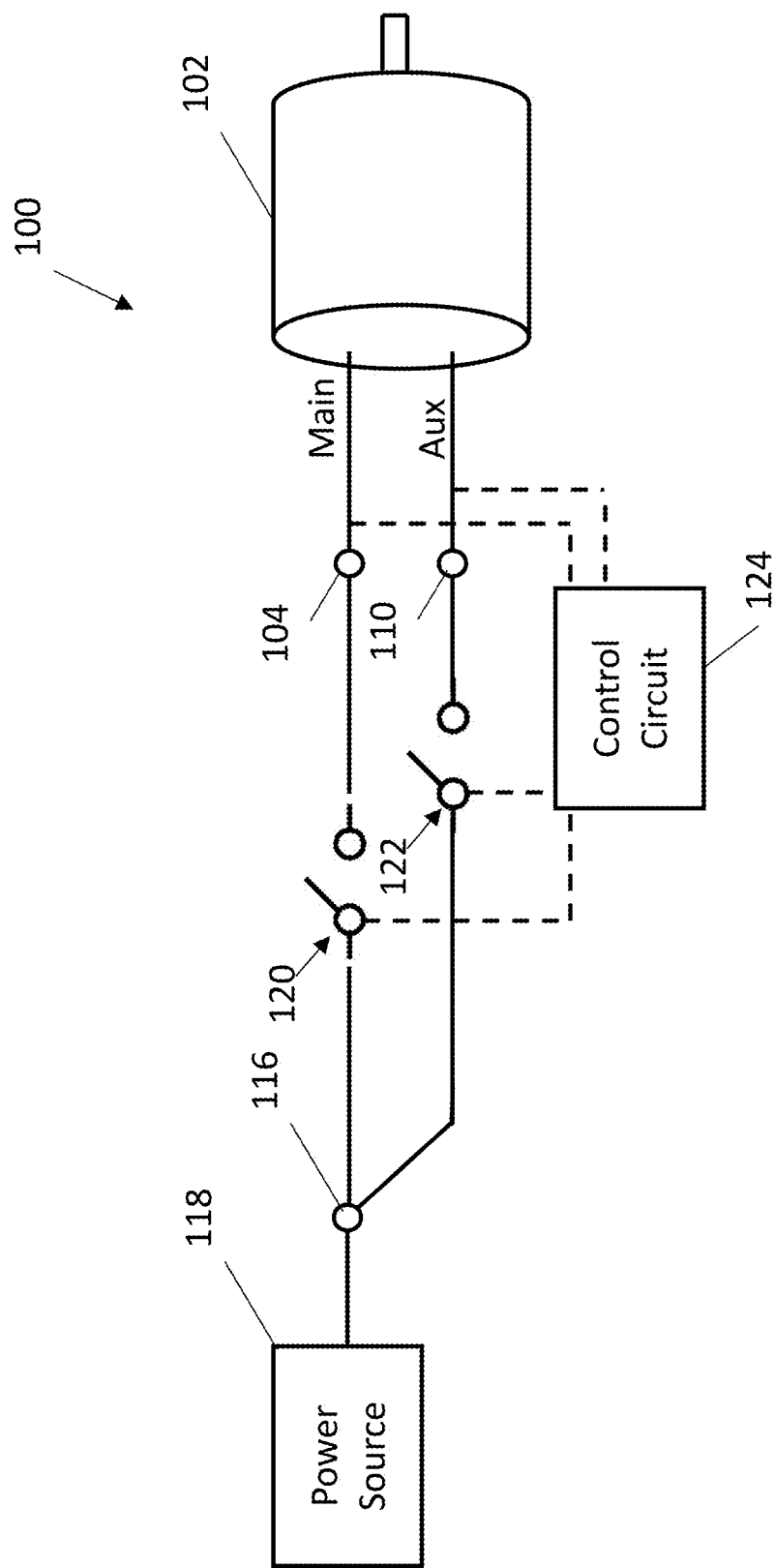
FIG. 1 is a block diagram of an induction motor assembly, according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
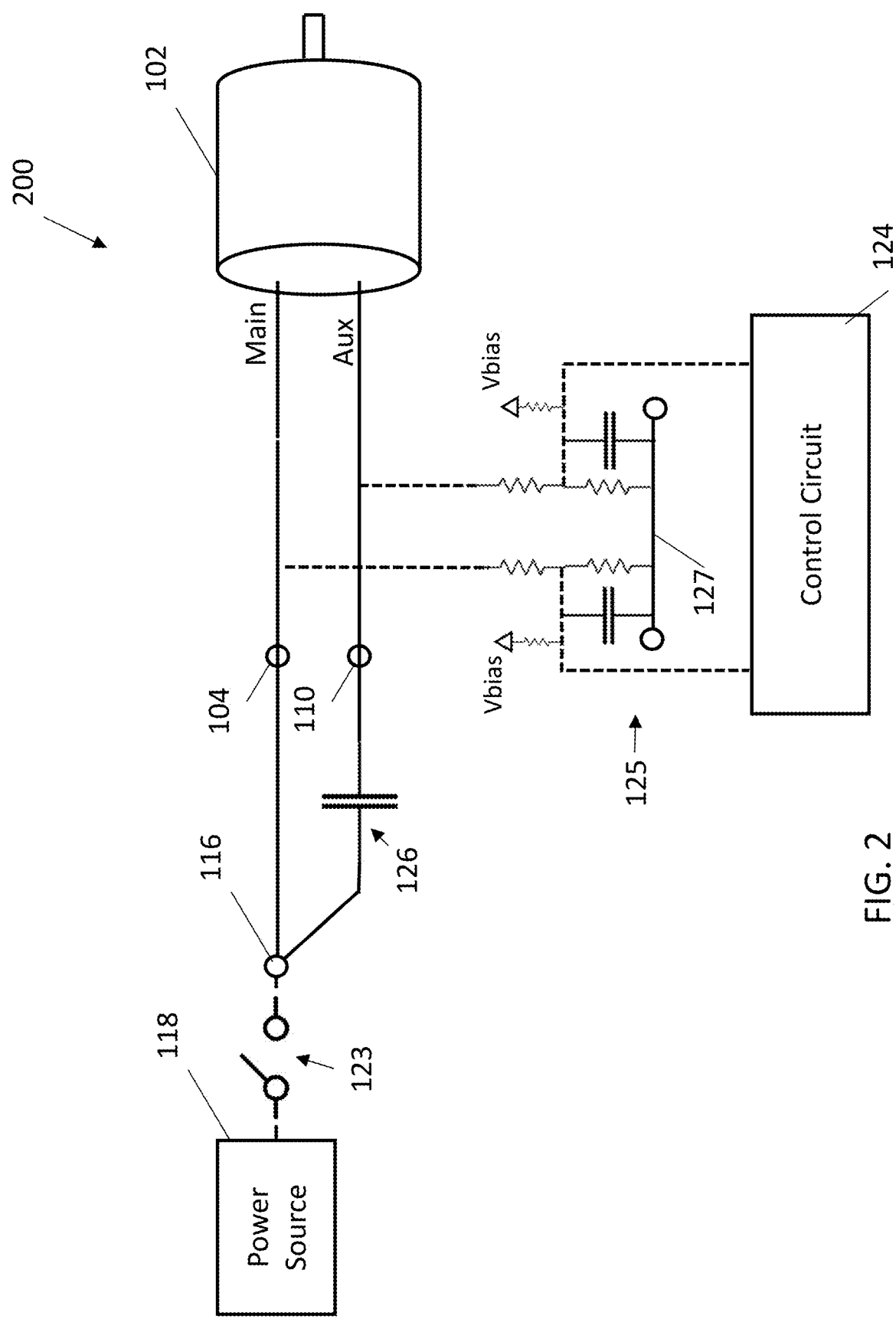
FIG. 2 is a block diagram of the induction motor assembly of FIG. 1, including an auxiliary capacitor.
Figure 3:
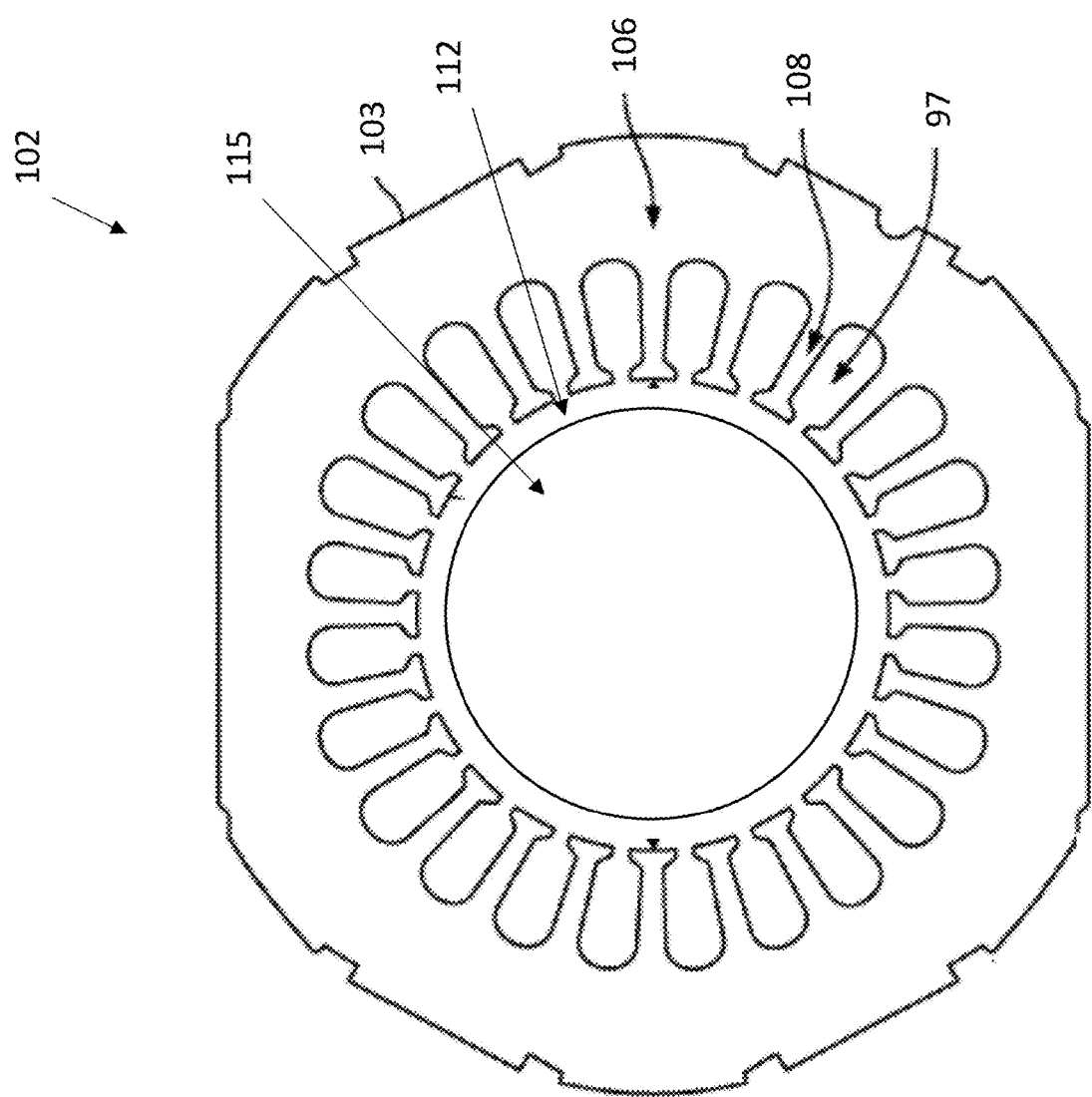
FIG. 3 is a top view of the motor of FIG. 1.
Figure 4:
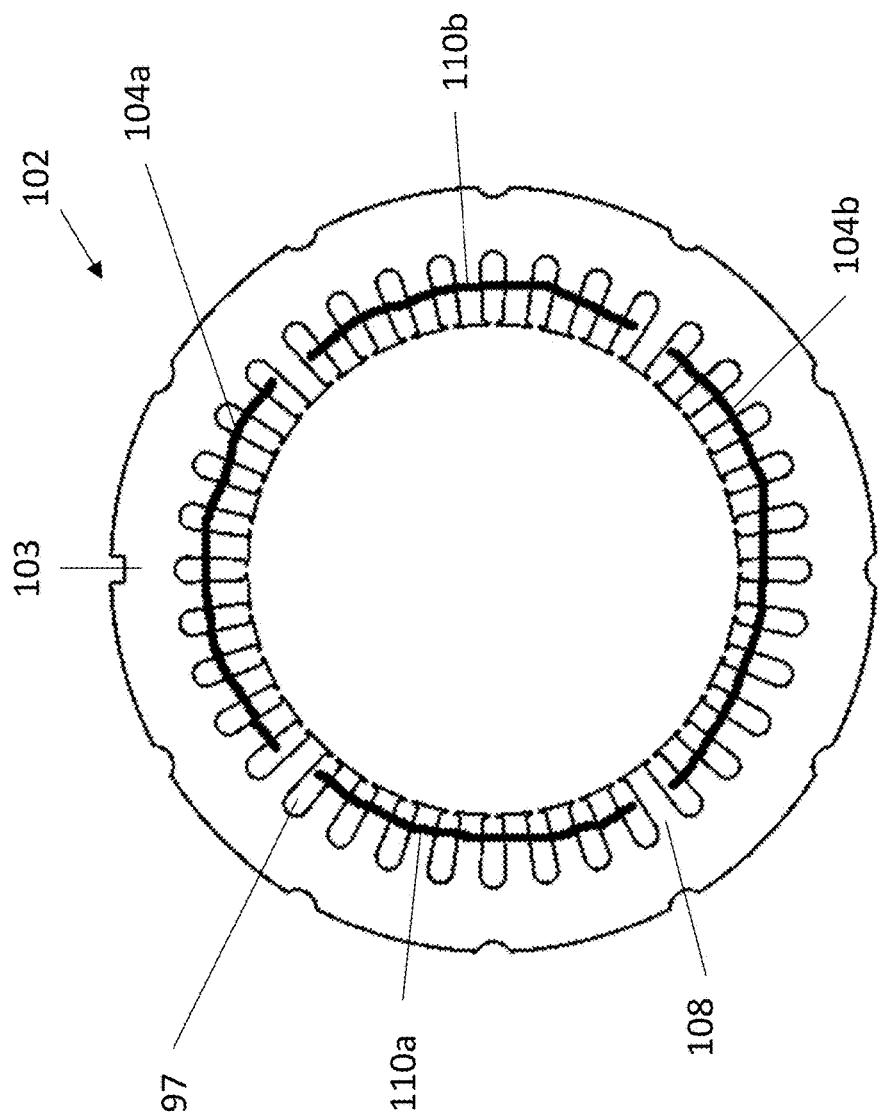
FIG. 4 is a top view of the motor of FIG. 1 illustrating an example winding pattern of the motor.

An induction motor assembly according to one example embodiment of the present disclosure is illustrated in FIGS. 1 and 3-4, and indicated generally by the reference number 100. An optional alternative arrangement of components is illustrated in FIG. 2. The assembly 100 includes an induction motor 102 having a stator core 103. The stator core 103 includes a stator yoke 106 and a plurality of teeth 108 extending from the stator yoke 106 toward a central opening 112. The central opening 112 extends from a first end of the stator core 103 to a second end of the stator core 103 opposite the first end. The plurality of teeth 108 are spaced apart from one another and define a plurality of slots 97 between the plurality of teeth 108.

The motor 102 further includes a main winding 104 and an auxiliary winding 110 located within the plurality of slots 97 and wrapped around the plurality of teeth 108. The main winding 104 is coupled with a line terminal 116 to receive power from a power source 118 (such as a power supply circuit that converts power from a utility power source). In other embodiments, the motor 102 may include more than one main winding 104, more than one auxiliary winding 110, etc.

As shown in FIG. 1, the assembly 100 includes a switch 120 coupled between the line terminal 116 and the main winding 104 to selectively inhibit the supply of power from the power source 118 to the main winding 104. Another switch 122 is coupled between the line terminal 116 and the auxiliary winding 110 to selectively inhibit the supply of power from the power source 118 to the auxiliary winding 110.

In some embodiments, the assembly 100 may include only the single switch 122 for selectively coupling the auxiliary winding 110 with the power source 118 (e.g., while the main winding 104 is always coupled with the power source 118). In various implementations, the switch 120 may be coupled to the output of the power source 118, such as electrically coupled between the power source 118 and the line terminal 116. Each switch 120 and 122 may include any suitable switching device, such as an electronic relay.

A control circuit 124 is coupled to control switching operation of the switch 120 and the switch 122. The control circuit 124 is configured to close the switch 120 and the switch 122 during a specified initial startup time period of the motor 102, to supply power from the power source 118 to the main winding 104 and the auxiliary winding 110 to start the motor 102. The control circuit 124 may be configured to open the switch 122 at the end of the specified initial startup time period.

For example, in some embodiments, the control circuit 124 may be configured to, after an initial startup from zero RPM, etc., detect a voltage of at least one of the main winding 104 and the auxiliary winding 110, to determine whether the motor 102 has reached a full startup speed. The control circuit 124 may briefly open the switch 122 to measure a voltage at the start winding 110, and then close the switch 122 again to continue supplying power to the auxiliary winding 110. The brief opening of the switch 122 may be for any duration needed to take a voltage measurement of the auxiliary winding 110, such as approximately one electrical cycle, approximately 1/16 of a second, etc. The detected voltage may be used to determine a speed of the motor 102 (e.g., via an equation calculation).

The voltage on the auxiliary winding 110 (sometimes referred to as a start winding), when either open or using a capacitor (such as the capacitor 126 illustrated in FIG. 2), will change as a load of the motor 102 changes. Therefore, voltage measurements on the main winding 104 and the auxiliary winding 110 may be used to estimate rotational speed and load of the motor 102. This may also allow for the prediction of other motor parameters such as power and approximate current levels (e.g. for protection of the motor 102).

In various implementations, a polynomial equation may incorporate phase information, such as the phase difference between the main and auxiliary winding voltages, to provide an enhanced estimate of the motor parameters. Capacitor variations and differences may be incorporated in the polynomial calculation, and may provide a prediction of capacitor degradation as a diagnostic.

As shown in FIG. 2, the assembly 200 may include an optional start capacitor 126 (which may be referred to as an auxiliary capacitor) coupled between the line terminal 116 and the auxiliary winding 110, to supply power from the power source 118 to the auxiliary winding 110. When the capacitor 126 is present, the control circuit 124 may measure a voltage of the start winding 110 without opening any switch. For example, if the switch 122 of FIG. 1 were present between the capacitor 126 and the auxiliary winding 110 in the assembly 200 of FIG. 2, the control circuit 124 may measure the voltage of the auxiliary winding 110 without opening the switch 122. This detected voltage may be used to determine a speed of the motor 102 (e.g., using a polynomial equation as described further below). In various implementations, the speed of the motor 102 may be determined based on only the voltage of the auxiliary winding 110 (e.g., if the line voltage is fixed or known and the capacitance value of the capacitor 126 is known). If the capacitance value is known, the speed of the motor 102 may optionally be determined based on the voltages of the main winding 104 and the auxiliary winding 110.

Alternatively, or additionally, a voltage of the capacitor 126 (such as an RMS capacitor voltage) may be used in the polynomial equation to provide the estimate of motor parameters. For example, the control circuit 124 may receive the RMS voltage of the capacitor 126 (instead of or in addition to determining the phase difference between the main and auxiliary winding voltages), and predict a rotational speed of the motor 102 based on the capacitor RMS voltage, the voltage of the main winding 104, and the voltage of the auxiliary winding 110.

FIG. 2 also illustrates a switch 123 coupled between the power source 118 and the terminal 116. In this embodiment, the switches 120 and 122 are not present. In various implementations, the assembly 100 or 200 may have more or less switches (or no switches), switches arranged at other locations in the motor, etc. The control circuit 124 may or may not control switching operation of each switch, and the switching operation control may or may not be based on a determined speed or load of the motor. The assemblies 100 and 200 are provided for purposes of example embodiment illustration, and the example motor speed and load detection methods described herein may be applied in other suitable motor implementations.

The assembly 200 includes a voltage divider circuit 125 coupled between the main and auxiliary windings 104 and 110, and the control circuit 124. This allows the control circuit 124 to sense the main and auxiliary winding voltages. For example, a first voltage divider includes two resistors coupled between the main winding 104 and the common winding 127 in series, and a second voltage divider includes two resistors coupled in series between the auxiliary winding 110 and the common winding 127 in series. A first capacitor is coupled between the midpoint of the two series-connected resistors coupled with the main winding 104 and the common winding 127, and a second capacitor is coupled between the midpoint of the two series-connected resistors coupled with the auxiliary winding 110 and the common winding 127. The control circuit 124 reads corresponding voltage values from the two midpoints. As shown in FIG. 2, each midpoint may be coupled to a voltage bias in the motor via one or more resistors. In other embodiments, the voltage divider 125 may not be coupled with a voltage bias. In various implementations, other suitable voltage sensing circuits may be used for the control circuit 124 to sense the main and auxiliary winding voltages. The detected voltages may be measured/determined as root mean square (RMS) voltages.

In various implementations, the line 127 may be a reference that is not at common, depending on the power supply. For example, the line 127 may be a microprocessor reference. In that case, a third measurement may be taken of a common line voltage to the reference line 127. in this example, the voltage divider 125 may include three different circuit values: one that reads a main-to-micro voltage, one that reads an auxiliary-to-micro voltage, and another that reads a common-to-micro voltage. In that case, a voltage of the main winding 104 may be determined according to the main-to-micro voltage minus the common-to-micro voltage, and a voltage of the auxiliary winding may be read as the auxiliary-to-micro voltage minus the common-to-micro voltage.

Referring again to FIG. 1, after startup of the motor 102, the control circuit 124 may be configured to detect a voltage of at least one of the main winding 104 and the start winding 110, and close the switch 122 in response to determination of an excess load condition of the motor. For example, during normal runtime operation of the motor 102, the control circuit 124 may periodically check the voltage(s) to determine whether the motor 102 is experiencing an excess load condition. If the determined load drops below a specified threshold value (e.g., indicating a low speed of the motor such as less than 500 RPM, indicating an excess current in the motor, etc.), the control circuit 124 may close the switch 122 to supply power to the auxiliary winding 110 to provide more power for the motor 102 to handle the excess load condition. In various implementations, the control circuit 124 may determine a rotational speed of the motor 102 directly based on the voltage(s) of the main winding 104 and/or auxiliary winding 110, and use the determined rotational speed based on the voltage(s) to decide when to close the switch 122 (e.g., such as when the determined speed based on the voltage(s) drops below the specified threshold value).

Once the excess load condition ends, the control circuit 124 may open the switch 122 to disconnect the auxiliary winding 110, so the motor 102 is driven only by power to the main winding 104 during normal runtime operation. For example, if the determined load reduces below the specified excess load condition, the control circuit 124 may open the switch 122. The control circuit 124 may be configured to close the switch 122 if the determined speed drops below a threshold value indicative of an excess load condition, and to open the switch 122 if the determined speed increases above the threshold value to indicate that the excess load condition has ended.

The control circuit 124 and the switches 120 and 122 may define an electronic switch implementation (for example, where the control circuit 124 is a microprocessor and the switches 120 and 122 are electronic relays), which provides both startup winding control and excess current protection.

For example, a microprocessor may determine when the motor has successfully started (e.g., based on measured voltage(s) of the main winding 104 and/or the auxiliary winding 110). The microprocessor may then open the switch 122 to disconnect the auxiliary winding 110 from the power source 118, while leaving the main winding 104 connected to the power source 118 for normal running operation.

Figure 5:
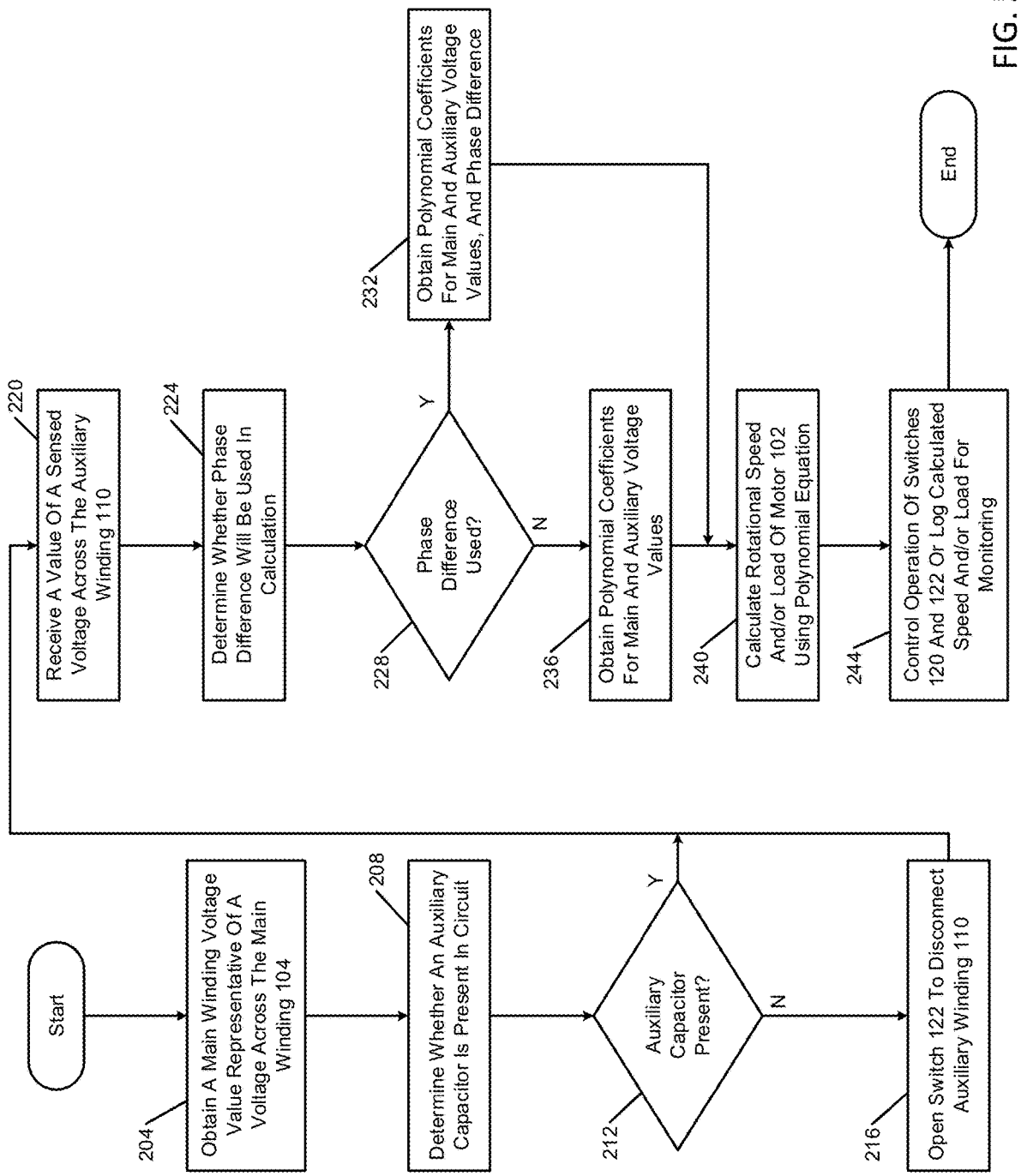
FIG. 5 is a flowchart depicting an example control process performed by the control circuit of FIG. 1, according to another example embodiment of the present disclosure.

FIG. 5 illustrates an example control process, which may be performed by the control circuit 124 to operate the switches 120 and/or 122. The process starts at 204, by obtaining a main winding voltage value representative of a voltage across the main winding 104. At 208, the control circuit determines whether an auxiliary capacitor is present, such as the capacitor 126 of FIG. 2. In various implementations, if the circuit is known to include the capacitor 126, the control circuit 124 may automatically proceed from 204 to 220 without an explicit determination of whether the capacitor is present (e.g., because software of the control circuit does not need to execute an if statement to check for the capacitor 126 if control circuit is already programmed according to knowledge that the capacitor 126 is present in the circuit).

If an auxiliary capacitor is not present at 212, the control circuit 124 opens the switch 122 to disconnect the auxiliary winding 110 at 216, prior to receiving a value of the sensed voltage across the auxiliary winding 110, at 220. If the auxiliary capacitor is present at 212, the control circuit 124 proceeds directly to 220 to receive the value of the sensed voltage across the auxiliary winding 110.

At 224, the control circuit 124 determines whether a phase difference will be used in the calculation of the motor rotational speed or load. If the phase difference will not be used at 228, control obtains polynomial coefficients for main and auxiliary voltage values at 236. If the phase difference will be used at 228, the control circuit 124 obtains polynomial coefficients for main and auxiliary voltages, as well as the phase difference, at 232. In various implementations, the explicit step of determining whether a phase difference will be used in the calculation at 224 may not be programmed into software of the control circuit 124 if it is already known that a phase difference will be used.

The control circuit 124 then calculates a rotational speed and/or load of the motor 102 using the polynomial equation and the obtained coefficients, at 240. At 244, the control circuit 124 controls operation of the switch 120 and/or the switch 122 according to the calculated speed and/or load, or logs the calculated speed and/or load for monitoring. For example, the calculated speed or load (or any other suitable parameter derived from the main and auxiliary voltage readings) may be used for various purposes, such as storing a history of motor parameters, displaying motor parameters for monitoring, using motor parameters to control other components, etc. Therefore, the example method of FIG. 5 may be used in other suitable embodiments that do not include the switches 120 and 122, that include switch(es) in other locations of the motor that may or may not be controlled by the control circuit 124, that do not include switches at all, etc.

As described above, the control circuit 124 may measure a voltage across the main winding 104, measure a voltage across the auxiliary winding 110, and optionally calculate a phase difference between the voltages in order to account for capacitor changes, such as variations of the capacitor 126 in FIG. 2. The control circuit 124 may then use the measured and calculated values to predict a speed of the motor 102, a load of the motor 102, etc.

In various implementations, the voltage changes on the main winding 104 and/or the auxiliary winding 110 may be small, so various approaches may be used to measure the voltages more accurately. For example, AC tracking may be used to measure voltage waveforms and determine a reference angle that can be used when calculating the phase difference between the voltages.

A filter may be used to take measurements, such as a digital filter of the control circuit 124 or a filter component coupled to the control circuit 124. This approach may be used when a slower response is acceptable, particularly if the phase difference is not required.

In various implementations, a potential divider may be used to obtain the voltages of the main winding 104 and the auxiliary winding 110. For example, a potential divider may be coupled between the control circuit 124 and the main winding 104 or auxiliary winding 110. In some embodiments, the main voltage may be a line voltage that is already being measured, so the example methods described herein may only add detection of the auxiliary winding 110.

In various implementations, main and auxiliary winding voltages may be sensed across different lines of the input power source. For example, if the line input includes a line L1 and a common line L2, the main voltage may be sensed across L1 and L2, and the auxiliary voltage may be sensed between an auxiliary winding and L2. This may be referred to as a main to common voltage and an auxiliary to common voltage.

An example polynomial for calculating the motor parameter(s) may be based on the voltage of the auxiliary winding 110 alone, the voltages of the auxiliary winding 110 and the main winding 104, the voltages of the auxiliary and main windings in combination with the phase difference between them, etc. For example, if a value of the capacitor 126 is known (or the capacitor 126 is not present in the assembly 100), the polynomial may use only the main and auxiliary voltages as inputs. If the line voltage is held to a high tolerance, the polynomial may use only the auxiliary winding voltage. An example polynomial is illustrated below.

$$\text{Speed} = p_0 + p_1 x + p_2 y + p_3 z + p_4 x^2 + p_5 xy + p_6 xz + p_7 y^2 + p_8 yz + p_9 z^2 + p_{10} x^3 + p_{11} x^2 y + p_{12} x^2 z + p_{13} xy^2 + p_{14} y^3 + p_{15} y^2 z + p_{16} xz^2 + p_{17} yz^2 + p_{18} z^3 + p_{19} xyz,$$

Equation 1.

where x=Main voltage, y=Aux voltage, z=Phase between main & aux voltages, and $p_0$-$p_{19}$ are coefficients In various implementations, the coefficients may be specified according to any suitable techniques, such as collecting data through initial testing of induction motors and subsequent fitting of the coefficients, etc. The equation above is an example only, and other embodiments may use other equation forms. For example, if only a rough speed prediction is needed to determine if the motor is stalling, a lower accuracy equation may be used.

Some embodiments may use multiple sets of coefficients, or multiple equation forms, to provide better fits or simpler equations. For example, one set of coefficients may be used when the motor 102 is operating in a first motor operation range (such as near full speed), while a second set of coefficients is used when the motor 102 is operating in a second motor operation range (such as near a breakdown torque).

As another example, a first set of coefficients may be used to determine a speed of the motor 102, a second set of coefficients may be used to determine a load of the motor 102, a third set of coefficients may be used to determine a capacitor value of the capacitor 126, and a fourth set of coefficients may be used to determine a current of the motor 102. In various implementations, calculations may be reduced by reusing variable terms multiple times. In some implementations, other parameters may be derived from the speed, load, etc., such as deriving a current from the speed or load, and deriving a power of the motor 102 based on the speed and load.

In various implementations, the speed or load of the motor may be determined via the main and auxiliary winding voltage via other suitable algorithms. For example, a look up table may store speed, load, or other suitable motor parameters according to main and auxiliary winding voltages, and the control circuit 124 may use the look up table to predict the motor speed, load, etc. based on sensed main and auxiliary winding voltages.

Returning to FIGS. 3 and 4, an example layout for the main and start windings of the motor 102, and a rotor body 115 of the motor 102, are illustrated. For example, the motor 102 includes a rotor body 115 located concentrically within the opening 112 of the stator core 103. The rotor body 115 includes an external surface that faces the stator core 103.

The plurality of teeth 108 extend radially inward from the stator yoke 106. The plurality of teeth 108 define the boundaries of the winding slots 97 that are each located between adjacent teeth 108. Collectively, interior ends of the plurality of teeth 108 define the central opening 112 that receives the rotor body 115. Each slot 97 has a proximate end nearest the central opening 112, and a distal end radially distant from the central opening 112. Although the teeth 108 and the winding slots 97 are illustrated as being equally spaced circumferentially about the stator core 103, in other embodiments various other known teeth and slot configurations may be used.

As used herein, the terms about and substantially may mean manufacturing tolerances, within plus or minus one percent, within plus or minus five percent, etc. Example dimensions and values used herein are for purposes of illustration only, and other embodiments may have smaller or larger dimensions or values.

FIG. 4 illustrates an example winding pattern for the main winding 104 including opposing sections 104a and 104b, and the start winding 110 (which may be referred to as an auxiliary winding) including opposing sections 110a and 110b. The windings may be formed by looping conducting wire including aluminum about the teeth 108. For example, the conducting wire may include aluminum, copper, etc.

The main winding sections 104a and 104b form the two main poles of the motor 102. The main winding sections 104a and 104b are shown as solid lines in FIG. 4 to illustrate example locations of the sections. Each winding section 104a and 104b may include multiple coils, which are each wound through the slots 97 about the teeth 108.

The start winding sections 110a and 110b collectively form two starting poles for the motor 102. The start winding sections 110a and 110b are shown as solid lines in FIG. 3 to illustrate example locations of the sections. Each winding section 110a and 110b may include multiple coils, which are each wound through the slots 97 about the teeth 108.

Figure 6:
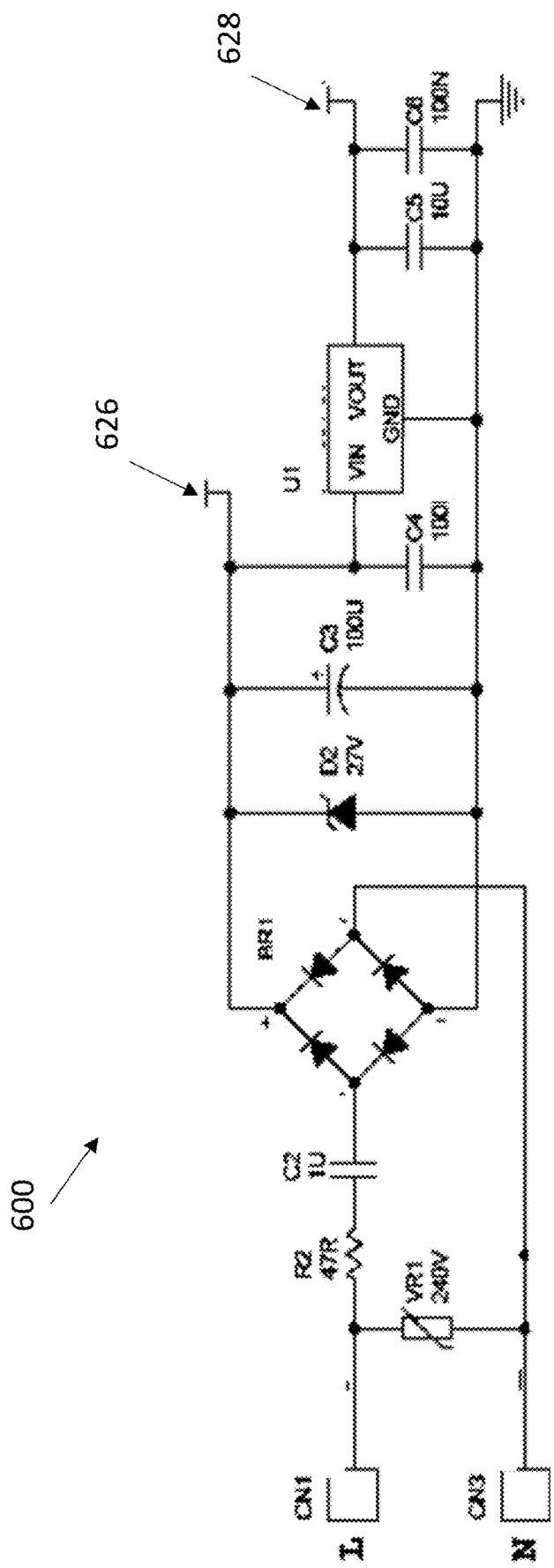
FIG. 6 is a circuit diagram of a power supply for supplying power to a microprocessor, according to another example embodiment of the present disclosure.

FIG. 6 is a circuit diagram showing details of an example power supply 600, which may be used in the assembly 100. For example, the power supply 600 may be part of the power source 118, may be coupled between the power source 118 and the line terminal 116, etc. In various implementations, any other suitable power supply circuits may be used, such as a small switching supply. The example power supply 600 may provide a low cost option for low current requirement implementations.

As shown in FIG. 6, the power supply 600 includes a terminal CN1 for connection to a line terminal of a power source, and a terminal CN2 for connection to a neutral terminal of a power source. A variable resistor VR1 is coupled between the terminals CN1 and CN2, which may include a metal oxide varistor (MOV) for transient protection. The power supply 600 includes a diode bridge BR1, which includes four diodes. A resistor R2 and a capacitor C2 are coupled in series between the terminal CN1 and the diode bridge BR1.

The diode bridge BR1 is coupled with a terminal 626, and the power supply 600 also includes a terminal 628. These terminals may be used to supply power to a microprocessor, a relay, etc. For example, the terminal 628 may be used to supply power to a microprocessor such as the control circuit 124 of FIG. 1, and the terminal 626 may have a higher voltage to supply power for relay control. A converter U1 may reduce a voltage from the diode bridge BR1 to a voltage that is suitable for a microprocessor.

For example, the diode bridge BR1 may supply a voltage of approximately 27V (e.g., as limited by a zener diode), and the converter U1 may reduce the voltage to 5V, 3.3V, etc. to power a microprocessor. The power supply 600 may include other suitable circuit components, such as the capacitors C4, C5 and C6 illustrated in FIG. 6.

As described herein, the example control circuits may include a microprocessor, microcontroller, integrated circuit, digital signal processor, etc., which may include memory. The control circuits may be configured to perform (e.g., operable to perform, etc.) any of the example processes described herein using any suitable hardware and/or software implementation. For example, the control circuits may execute computer-executable instructions stored in a memory, may include one or more logic gates, control circuitry, etc. In some embodiments, the control circuit 124 and/or the switches 120 and 122 may include an analog circuit implementation, a digital circuit implementation, a coordinated switching logic circuit, a low current switching device, etc.

In some embodiments, the switches 120 and/or 122 may be switched at less than maximum current (e.g., at approximately zero current). For example, the control circuit 124 may detect a voltage of the power source 118, the main winding 104 and/or the start winding 110, and then operate the switch 120 and/or 122 when the detected voltage is outside of a peak voltage range (such as a peak voltage value, a range of 50% to 100% of the peak voltage value, etc.).

FIG. 7A illustrates an example simulated speed 700 of the motor 102, as measured using a filter (such as a digital filter of the control circuit 124 or a filter component coupled with an input of the control circuit 124). FIG. 7A illustrates starting of the motor 102 followed by a step load. Therefore, the motor speed ramps up initially to a higher steady state speed value during startup, then drops off to a lower steady state speed after the load increases.

FIG. 7B illustrates an example simulated voltage 702 of the auxiliary winding 110, as measured using a filter. As shown in FIG. 7B, the voltage on the auxiliary winding 110 increases initially to a higher steady state value during startup of the motor 102, then drops off to a lower steady state value after a step load is applied. The voltage waveform 702 corresponds to the simulated speed 700 of FIG. 7A, indicating that in this example the voltage on the auxiliary winding 110 may be used to predict the speed of the motor 102.

Figure 8:
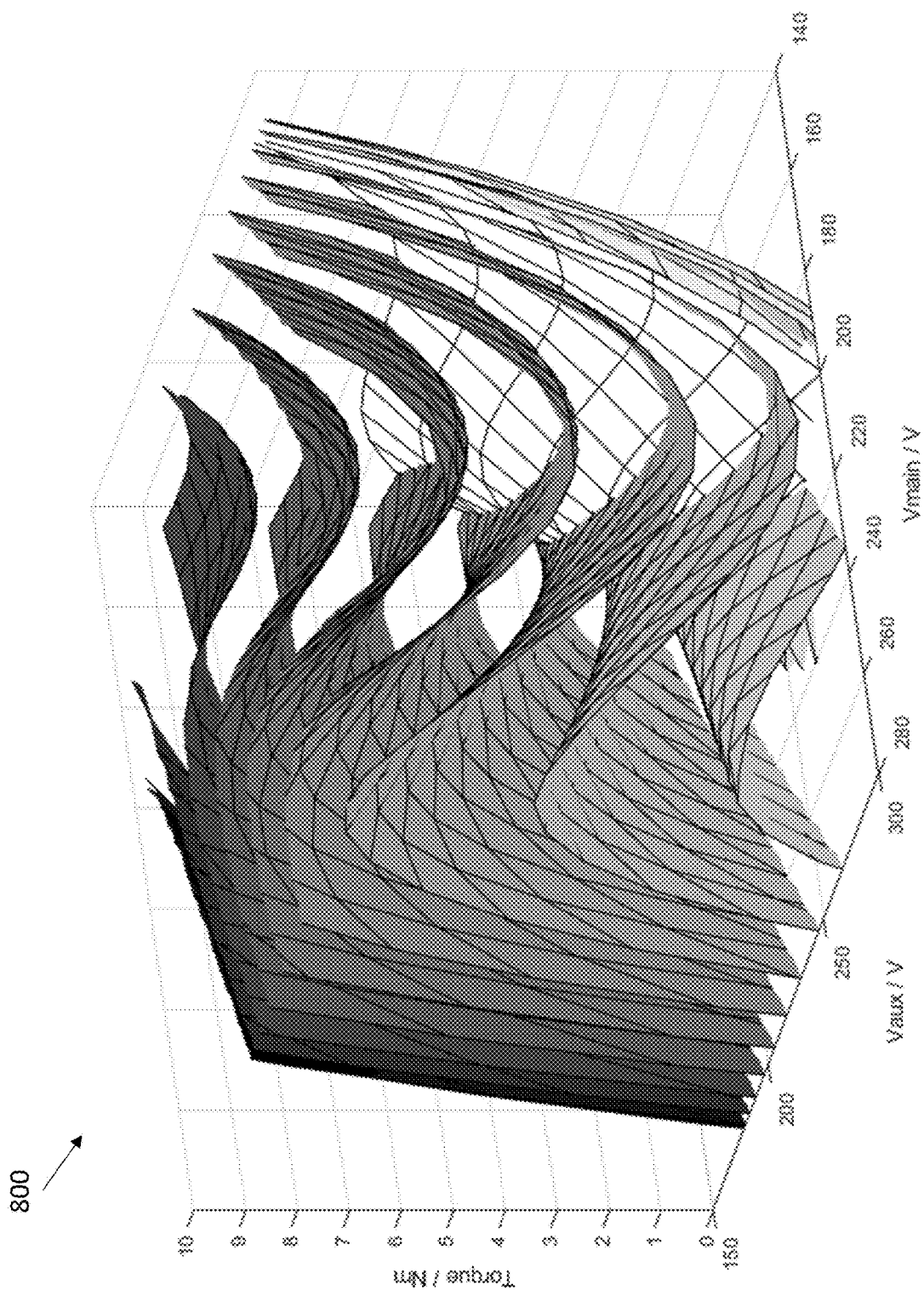
FIG. 8 is a graph illustrating example curve fitting surfaces for polynomial coefficients used for motor parameter prediction.

FIG. 8 is a graph 800 illustrating example curve fitting surfaces for polynomial coefficients used for motor parameter prediction. For example, FIG. 8 illustrates a representation of a four dimensional surface, using multiple three dimensional surfaces. Each surface represents a different step of phase angles between the main and auxiliary winding voltages (such as 2.5 degree steps from about seventy degrees up to about one hundred degrees).

The coefficients of a corresponding polynomial are determined by fitting data points measured from motor operations values. For example, a curve fitting algorithm may be used on a set of measured motor data points at various speeds, torques, phase angles, main and auxiliary voltages, etc., to generate the multiple surfaces (such as by using a least squares surface fit, pseudo inverse matrix or array). Then, if main and auxiliary winding voltages are measured from a motor, and a phase angle is determined, the surfaces of the graph 800 may be used to predict a current torque of the motor (or a current speed or other desired prediction parameter that has been modeled).

In various implementations, polynomial coefficients may be tuned to increase desired motor control performance. For example, the coefficients may be weighted in areas within the parameter space that are more important to motor operation (such as areas where the motor spends most of its time operating), or more measurements may be taken from a sample motor in the more important operation parameter areas to give better prediction accuracy for improved control. Less adjustment or precision may be needed at areas where the motor does not normally operate. For example, it may be difficult to take accurate measurements when a motor is close to stalling out, so smaller weights may be used for such areas in the parameter space.

As mentioned above, in various implementations multiple polynomial equations may be used for different situations, which have different coefficients. For example, two different sets of polynomial equations could be used for different capacitor values coupled with an auxiliary winding or main winding (such as a first set of coefficients for capacitors in a range of 25 to 45 microfarads and another set of coefficients for capacitors in a range of 125 to 185 microfarads).

According to another embodiment of the present disclosure, a method of controlling an induction motor assembly is disclosed. The assembly includes an induction motor having a stator core that includes a stator yoke and a plurality of teeth extending from the stator yoke toward a central opening, with the central opening extending from a first end of the stator core to a second end of the stator core opposite the first end, and the plurality of teeth spaced apart from one another and defining a plurality of slots between the plurality of teeth. The motor further includes a main winding and an auxiliary winding located within the plurality of slots and wrapped around the plurality of teeth, a first switch coupled between the line terminal and the main winding, and a second switch coupled between the line terminal and the auxiliary winding.

The method includes obtaining a main winding voltage value representative of a voltage across the main winding, receiving an auxiliary winding voltage value according to a sensed voltage across the auxiliary winding, and determining at least one of a rotational speed of the induction motor and a load of the induction motor, according to the main winding voltage value and the auxiliary winding voltage value. The method incudes controlling switching operation of at least one of the first switch and the second switch according to the determined rotational speed or the determined load.

In various implementations, the method includes calculating a phase difference between the voltage across the main winding and the voltage across the auxiliary winding. For example, calculating the phase difference may include tracking a waveform of the voltage across the main winding to generate a main phase angle, tracking another waveform of the voltage across the auxiliary winding to generate an auxiliary phase angle, and determining the phase differences according to the main phase angle and the auxiliary phase angle. Example techniques for determining phase differences by tracking voltage waveforms and generating phase angles are discussed in U.S. Pat. Nos. 8,264,860 and 10,305,537. The entire disclosures of these references are incorporated herein by reference.

Determining may include determining the rotational speed or the load according to the calculated phase difference, the main winding voltage value and the auxiliary winding voltage value. In various implementations, the method may include opening the second switch prior to receiving the auxiliary winding voltage value according to the sensed voltage across the auxiliary winding.

Determining may include determining the rotational speed or the load according to a polynomial equation having specified coefficients, without using a look up table, wherein the main winding voltage value and the auxiliary winding voltage value comprise inputs to the polynomial equation. The method may include calculating a phase difference between the voltage across the main winding and the voltage across the auxiliary winding, wherein the phase difference comprises one or more inputs to the polynomial equation.

In various implementations, the method may include determining at least one of a power of the induction motor and a current of the induction motor, according to the determined rotational speed and load of the induction motor, wherein controlling includes controlling the switching operation of the first switch or the second switch according to the determined power or the determined current of the induction motor. The assembly may include a capacitor coupled between the line terminal and the second switch, where the method further includes determining a degradation value of the capacitor according to the calculated phase difference and at least one of the main winding voltage and the auxiliary winding voltage.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An induction motor assembly comprising:
an induction motor including a stator core having a stator yoke and a plurality of teeth extending from the stator yoke toward a central opening, the central opening extending from a first end of the stator core to a second end of the stator core opposite the first end, the plurality of teeth spaced apart from one another and defining a plurality of slots between the plurality of teeth, the induction motor further including a main winding and an auxiliary winding located within the plurality of slots and wrapped around the plurality of teeth, the main winding coupled with a line terminal to receive power from a power source, and the auxiliary winding coupled with the line terminal to receive power from the power source;
one or more switches coupled between the line terminal and at least one of the main winding and the auxiliary winding to selectively inhibit the supply of power from the power source to the at least one of the main winding and the auxiliary winding;

a control circuit coupled to control switching operation of the one or more switches, the control circuit configured to:

obtain a main winding voltage value representative of a voltage across the main winding;

receive an auxiliary winding voltage value according to a sensed voltage across the auxiliary winding;

calculate a phase difference between the voltage across the main winding and the voltage across the auxiliary winding;

determine at least one of a rotational speed of the induction motor and a load of the induction motor, according to the calculated phase difference, the main winding voltage value and the auxiliary winding voltage value; and control switching operation of the one or more switches according to the determined rotational speed or the determined load, or generate a log of the determined rotational speed or the determined load in memory for monitoring.

2. The assembly of claim 1, wherein calculating the phase difference includes:

tracking a waveform of the voltage across the main winding to generate a main phase angle;

tracking another waveform of the voltage across the auxiliary winding to generate an auxiliary phase angle; and determining the phase difference according to the main phase angle and the auxiliary phase angle.

3. The assembly of claim 1, further comprising a capacitor coupled between the line terminal and the auxiliary winding.

4. The assembly of claim 1, wherein the control circuit is configured to open at least one of the one or more switches prior to receiving the auxiliary winding voltage value according to the sensed voltage across the auxiliary winding.

5. The assembly of claim 1, further comprising a voltage divider coupled between the control circuit and at least one of the main winding and the auxiliary winding, to facilitate obtaining the main winding voltage value or the auxiliary winding voltage value.

6. The assembly of claim 1, wherein:

the control circuit is configured to determine at least one of a power of the induction motor and a current of the induction motor, according to the determined rotational speed and load of the induction motor; and controlling includes controlling the switching operation of a first switch or a second switch according to the determined power or the determined current of the induction motor.

7. The assembly of claim 1, wherein:

the control circuit comprises a digital microprocessor; and the induction motor comprises a single phase induction motor.

8. An induction motor assembly comprising:

an induction motor including a stator core having a stator yoke and a plurality of teeth extending from the stator yoke toward a central opening, the central opening extending from a first end of the stator core to a second end of the stator core opposite the first end, the plurality of teeth spaced apart from one another and defining a plurality of slots between the plurality of teeth, the induction motor further including a main winding and an auxiliary winding located within the plurality of slots and wrapped around the plurality of teeth, the main winding coupled with a line terminal to receive power from a power source, and the auxiliary winding coupled with the line terminal to receive power from the power source;

one or more switches coupled between the line terminal and at least one of the main winding and the auxiliary winding to selectively inhibit supply of power from the power source to the at least one of the main winding and the auxiliary winding;

a control circuit coupled to control switching operation of the one or more switches, the control circuit configured to:

obtain a main winding voltage value representative of a voltage across the main winding;

receive an auxiliary winding voltage value according to a sensed voltage across the auxiliary winding;

determine at least one of a rotational speed of the induction motor or a load of the induction motor, according to a polynomial equation having specified coefficients, wherein the main winding voltage value and the auxiliary winding voltage value comprise inputs to the polynomial equation; and control switching operation of the one or more switches according to the determined rotational speed or the determined load, or generate a log of the determined rotational speed or the determined load in memory for monitoring.

9. The assembly of claim 8, wherein:

the control circuit is configured to calculate a phase difference between the voltage across the main winding and the voltage across the auxiliary winding; and the phase difference comprises one or more inputs to the polynomial equation.

10. The assembly of claim 9, wherein:

the polynomial equation has a form of rotational speed or load=$p_0+p_1x+p_2y+p_3z+p_4x^2+p_5xy+p_6xz+p_7y^2+p_8yz+p_9z^2+p_{10}x^3+p_{11}x^2y+p_{12}x^2z+p_{13}xy^2+p_{14}y^3+p_{15}y^2z+p_{16}xz^2+p_{17}yz^2+p_{18}z^3+p_{19}xyz$;

x is the main winding voltage value;

y is the auxiliary winding voltage value;

z is the phase difference; and $p_0$-$p_{19}$ are the specified coefficients.

11. The assembly of claim 8, wherein the control circuit is configured to use a first set of specified coefficients to determine the rotational speed of the induction motor and a second set of specified coefficients to determine the load of the induction motor.

12. The assembly of claim 8, wherein the control circuit is configured to use a first set of specified coefficients to determine the rotational speed or load of the induction motor when the induction motor is operating in a first motor operation range, and a second set of specified coefficients to determine the rotational speed or load of the induction motor when the induction motor is operating in a second motor operation range.

13. A method of controlling an induction motor assembly, the assembly including an induction motor having a stator core including a stator yoke and a plurality of teeth extending from the stator yoke toward a central opening, the central opening extending from a first end of the stator core to a second end of the stator core opposite the first end, the plurality of teeth spaced apart from one another and defining a plurality of slots between the plurality of teeth, the induction motor further including a main winding and an auxiliary winding located within the plurality of slots and wrapped around the plurality of teeth, the assembly including one or more switches coupled between a line terminal of a power source and at least one of the main winding and the auxiliary winding, the method comprising:
- obtaining a main winding voltage value representative of a voltage across the main winding;
- obtaining an auxiliary winding voltage value representative of a voltage across the auxiliary winding;
- calculating a phase difference between the voltage across the main winding and the voltage across the auxiliary winding;
- determining at least one of a rotational speed of the induction motor and a load of the induction motor, according to the calculated phase difference, the main winding voltage value and the auxiliary winding voltage value; and
- controlling switching operation of the one or more switches according to the determined rotational speed or the determined load, or generating a log of the determined rotational speed or the determined load in memory for monitoring.

14. The method of claim 13, wherein calculating the phase difference includes:
- tracking a waveform of the voltage across the main winding to generate a main phase angle;
- tracking another waveform of the voltage across the auxiliary winding to generate an auxiliary phase angle; and
- determining the phase difference according to the main phase angle and the auxiliary phase angle.

15. The method of claim 13, further comprising opening at least one of the one or more switches prior to receiving the auxiliary winding voltage value according to the voltage across the auxiliary winding.

16. The method of claim 13, wherein determining includes determining the rotational speed or the load according to a polynomial equation having specified coefficients, and the main winding voltage value and the auxiliary winding voltage value comprise inputs to the polynomial equation.

17. The method of claim 16, wherein the phase difference comprises one or more inputs to the polynomial equation.

18. The method of claim 13, further comprising determining at least one of a power of the induction motor and a current of the induction motor, according to the determined rotational speed and load of the induction motor, wherein controlling includes control the switching operation of a first switch or a second switch according to the determined power or the determined current of the induction motor.

19. The method of claim 13, wherein the assembly includes a capacitor coupled between the line terminal and one of the one or more switches, the method further comprising determining a degradation value of the capacitor according to the calculated phase difference and at least one of the main winding voltage value and the auxiliary winding voltage value.

* * * * *